US008916052B2

(12) United States Patent
Li et al.

(10) Patent No.: US 8,916,052 B2
(45) Date of Patent: Dec. 23, 2014

(54) RESIST TECHNIQUE

(71) Applicant: Taiwan Semiconductor Manufacturing Company, Ltd., Hsin-Chu (TW)

(72) Inventors: Jung-Jui Li, Hsin-chu (TW); Buh-Kuan Fang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 13/757,377

(22) Filed: Feb. 1, 2013

(65) Prior Publication Data

US 2014/0220780 A1  Aug. 7, 2014

(51) Int. Cl.
*B44C 1/22* (2006.01)
*H01L 21/308* (2006.01)

(52) U.S. Cl.
CPC .................................. *H01L 21/308* (2013.01)
USPC ................. 216/41; 216/49; 438/715; 438/725

(58) Field of Classification Search
CPC ... H01L 21/0273; H01L 21/312; H01L 21/47; H01L 21/4757; H05K 3/064
USPC ................................ 216/41, 49; 438/715, 725
See application file for complete search history.

(56) References Cited

U.S. PATENT DOCUMENTS

| 6,137,088 | A * | 10/2000 | Chen et al. ..................... 219/390 |
| 6,461,801 | B1 | 10/2002 | Wang |
| 2001/0000409 | A1 * | 4/2001 | Mitsuhashi ................ 250/492.2 |
| 2004/0214448 | A1 | 10/2004 | Chan et al. |
| 2005/0079717 | A1 * | 4/2005 | Savas et al. .................... 438/689 |
| 2007/0287291 | A1 | 12/2007 | George et al. |
| 2012/0052687 | A1 | 3/2012 | Raghavan et al. |

* cited by examiner

*Primary Examiner* — Binh X Tran
(74) *Attorney, Agent, or Firm* — Haynes and Boone, LLP

(57) ABSTRACT

The present disclosure provides various methods for removing a resist layer from a wafer. An exemplary method includes performing an etching process to remove a resist layer from a wafer. During the etching process, a first heating process is performed to effect a first graded thermal profile in the resist layer, the first graded thermal profile having a temperature that increases along a direction perpendicular to the wafer. Further during the etching process, and after performing the first heating process, a second heating process is performed to effect a second graded thermal profile in the resist layer, the second graded thermal profile having a temperature that decreases along the direction perpendicular to the wafer. In an example, the method further includes, before performing the etching process, performing an ion implantation process to the wafer using the resist layer as a mask.

20 Claims, 6 Drawing Sheets

RESIST TECHNIQUE

BACKGROUND

Integrated circuit (IC) technologies are continually progressing to smaller feature sizes, for example, down to 65 nanometers, 45 nanometers, and below. Various patterned resist layers are used to transfer a designed pattern to a wafer to form a desired IC device. For example, various resist layers are used to form multiple material layers of the wafer that combine to form a complementary metal-oxide-semiconductor device. During wafer processing, complete removal of each resist layer from the wafer is desired since resist material remaining on the wafer can cause defects in the fabricated ICs. Such removal is performed carefully to avoid chemically modifying or physically damaging the wafer. Although existing resist removal techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
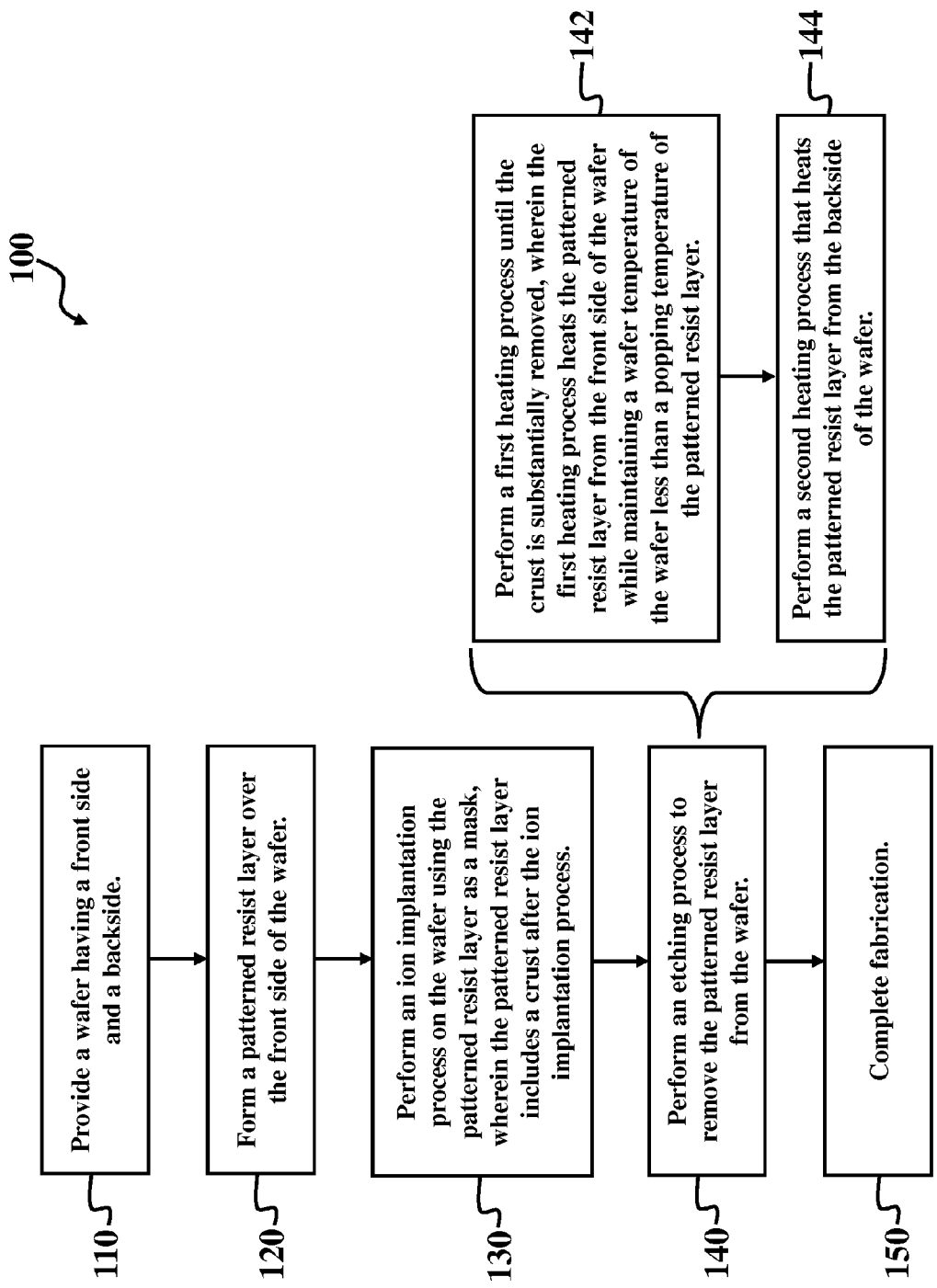
FIG. 1 is a flow chart of a method for removing a resist layer from a wafer according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method for removing a resist layer from a wafer according to various aspects of the present disclosure. The method 100 begins at block 110 and block 120 where a wafer having a front side and a backside is provided, and a patterned resist layer is formed over the front side of the wafer. At block 130, an ion implantation process is performed on the wafer using the patterned resist layer as a mask. In an example, a doped region is formed in the wafer using the ion implantation process. After the ion implantation process, the pattered resist layer includes a crust. At block 140, an etching process is performed to remove the patterned resist layer from the wafer. During the etching process, at block 142, a first heating process is performed until the crust is substantially removed. The first heating process heats the pattered resist layer from the front side of the wafer while maintaining a wafer temperature of the wafer less than a popping temperature of the patterned resist layer. During the etching process, at block 144, a second heating process is performed that heats the patterned resist layer from the backside of the wafer. At block 150, fabrication on the wafer is completed. Additional steps can be provided before, during, and after the method 100, and some of the steps described can be replaced, eliminated, or moved around for additional embodiments of the method 100.

Figure 2:
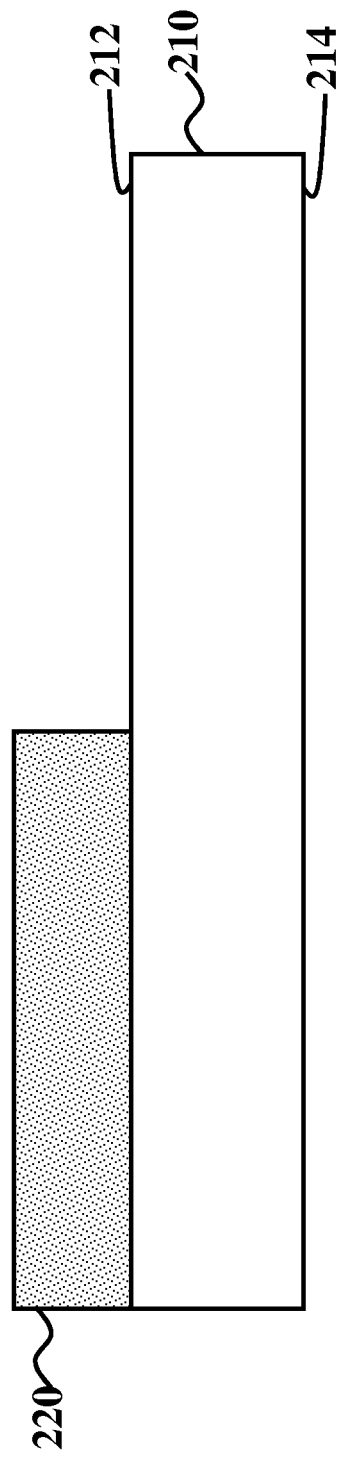
FIGS. 2-6 are various diagrammatic cross-sectional views of a resist layer during various stages of the method of FIG. 1 according to various aspects of the present disclosure.

FIGS. 2-6 are various diagrammatic cross-sectional views of a resist layer during various stages of the method 100 of FIG. 1 according to various aspects of the present disclosure. FIGS. 2-6 have been simplified for the sake of clarity to better understand the inventive concepts of the present disclosure. In FIG. 2, a wafer 210 having a front side 212 and a backside 214 is provided. The wafer 210 is a substrate (for example, a semiconductor substrate), a mask (also referred to as a photomask or reticle), or any base material on which processing may be conducted to provide layers of material to form various features of an integrated circuit (IC) device. In the depicted embodiment, the wafer 210 is a semiconductor substrate including silicon (in other words, a silicon wafer). Alternatively or additionally, the wafer 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the wafer 210 is a semiconductor on insulator (SOI). The wafer 210 may alternatively be referred to as a material layer, or the wafer 210 may include a material layer upon which a resist layer will be formed. In an example, the material layer is a metal layer, a semiconductor layer, or a dielectric layer. In another example, the material layer is a hard mask layer, such as a silicon oxide layer or a silicon nitride layer.

A patterned resist layer 220 is formed over the wafer 210, particularly over the front side 212 of the wafer 210. The patterned resist layer 220 is also referred to as a photoresist layer, photosensitive layer, imaging layer, patterning layer, or radiation sensitive layer. The patterned resist layer 220 includes a positive-type resist material, a negative-type resist material, other type material, or combination thereof. The patterned resist layer 220 is formed over the wafer 210 by a lithography process. The lithography process includes resist coating (for example, spin-on coating), soft baking, mask aligning, exposure, post-exposure baking, developing the resist, rinsing, drying (for example, hard baking), other suitable processes, or a combination thereof. Alternatively, the lithography process is implemented or replaced by other methods, such as maskless lithography, electron-beam writing, or ion-beam writing. In yet another alternative, the lithography process implements nanoimprint technology to pattern the resist layer. In some examples, the lithography process implements an etching process, such as a dry etching, wet etching, other etching method, or combination thereof. A rinsing process, such as a de-ionized (DI) water rinse, may be performed on the wafer 210 before forming the resist layer 220.

Figure 3:
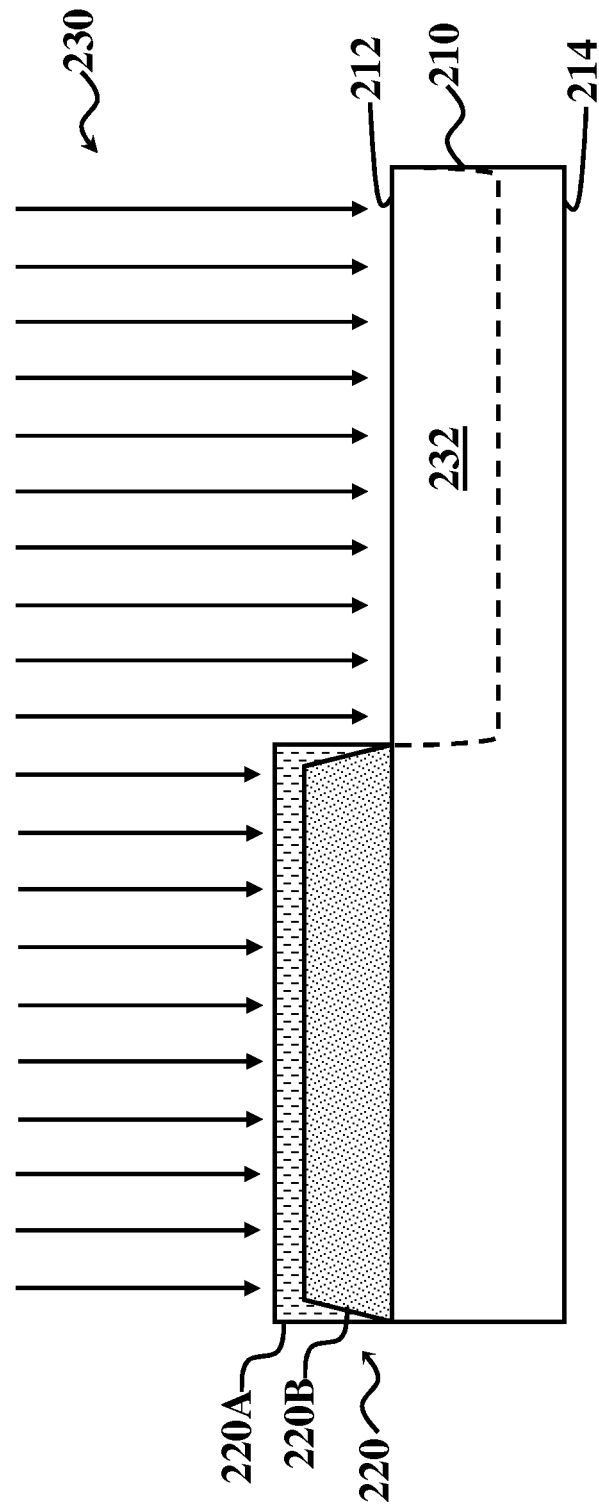

The patterned resist layer 220 includes an opening that exposes a portion of the wafer 210 as illustrated in FIG. 2. In FIG. 3, a process 230 is performed on the wafer 210 using the patterned resist layer 220 as a mask. In the depicted embodiment, the process 230 is an ion implantation process that forms a doped region 232 in the wafer 210. The ion implantation process implants p-type dopants (such as boron or indium), n-type dopants (such as phosphorous or arsenic), or a combination thereof. In an example, the doped region 232 is a well or a source/drain region of an integrated circuit device, such as a transistor. The ion implantation process is performed at a suitable energy and dosage to achieve desired characteristics of the integrated circuit device. In the present example, the ion implantation process is a high dosage ion implantation process that uses, for example, an implant dosage of greater than or equal to about $3 \times 10^{10}$ ions/cm$^2$.

The process 230 alters the patterned resist layer 220, resulting in an altered portion 220A and an unaltered portion 220B of the patterned resist layer 220. In the present example, the ion implantation process causes physical and chemical changes in the patterned resist layer 220, such that a portion of the patterned resist layer 220 is hardened (designated as portion 220A in FIG. 3). The altered portion 220A is also referred to as a hardened portion or a crust of the patterned resist layer 220. Such physical and chemical changes result from various phenomena including dopants embedded in the patterned resist layer 220 during the ion implantation process, cross-linking of polymer chains of the patterned resist layer 220 during the ion implantation process (caused by the dopants altering polymer properties of the resist material, which carbonizes and hardens portions of the patterned resist layer 220A exposed to the dopants), dopants sputtering atoms from the wafer 210 to the patterned resist layer 220A, other phenomena, or a combination thereof.

The hardened portion 220A of the patterned resist layer 220 exhibits low reactivity to resist removal processes, particularly plasma ash processes. Accordingly, resist removal processes require high temperatures to effectively remove the hardened portion 220A of the patterned resist layer 220. Resist removal techniques typically achieve such high temperatures by heating the wafer 210 (for example, to temperatures greater than about 250° C.) from the backside, thereby heating the patterned resist layer 220. When the resist layer is heated via heating the backside 214 of the wafer 210 to achieve the high temperatures required for removing the hardened portion 220A, gases and/or pressure accumulates in the portion 220B of the patterned resist layer 220. The gases can explosively erupt, resulting in the resist material "popping" (where the gases (and/or pressure) built up in the portion 220B "pops" through the hardened, crust portion 220A). The popping temperature for the patterned resist layer 220 varies depending on resist type, resist thickness, pattern density, resist formation conditions (for example, post exposure baking conditions), other conditions, or a combination thereof. Further, if the patterned resist layer 220 is subjected to the high temperature environment for too long, portions of the hardened portion 220A may further harden and remain over the wafer 210. Another resist removal technique that adequately removes the patterned resist layer 220 is a chemical stripping process, such as a hydrogen chemical stripping process. Conventional chemical stripping processes undesirably leave a net charge on the wafer 210 that can negatively affect subsequent processing and device performance of a fabricated integrated circuit device. Yet another resist removal technique implements a wet etching process to remove the patterned resist layer 220. Although the wet etching process can adequately remove the hardened portion 220A of the patterned resist layer 220, the wet etching process typically requires spinning the wafer 210 to adequately remove the wet etching solution, which often result in features of the wafer 210 (for example, gate line features) breaking or falling.

Figure 4:
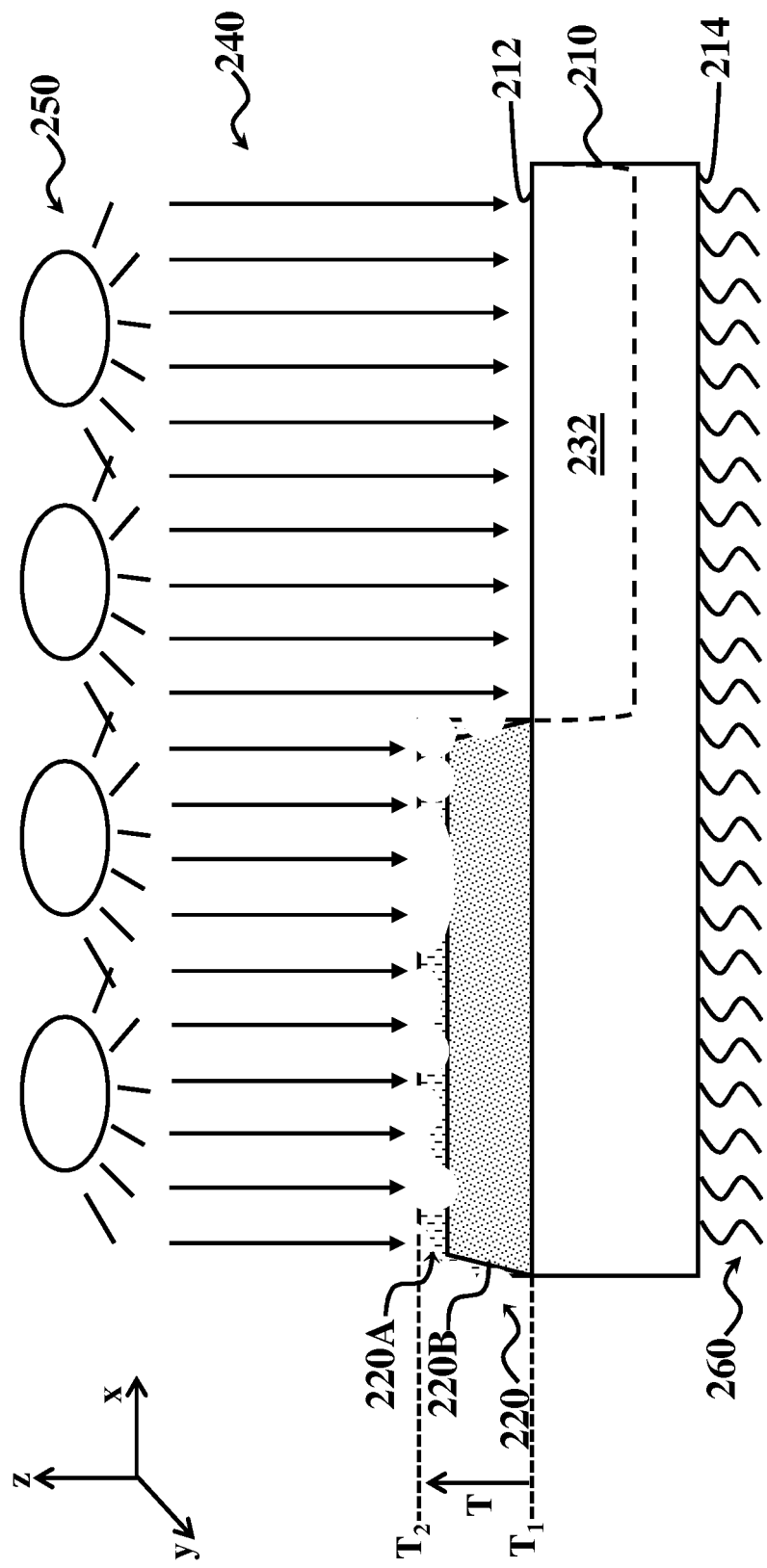
Figure 5:
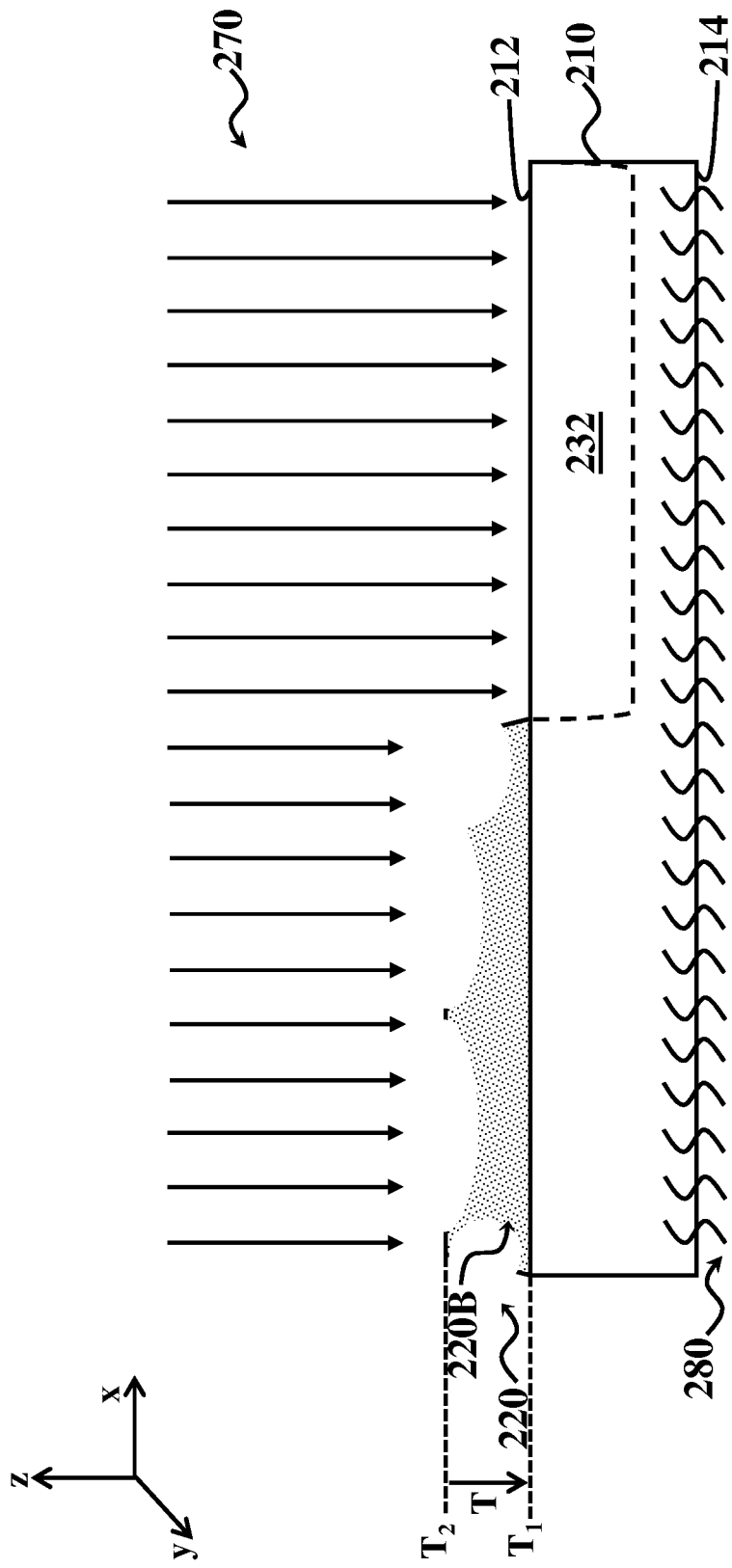
Figure 6:
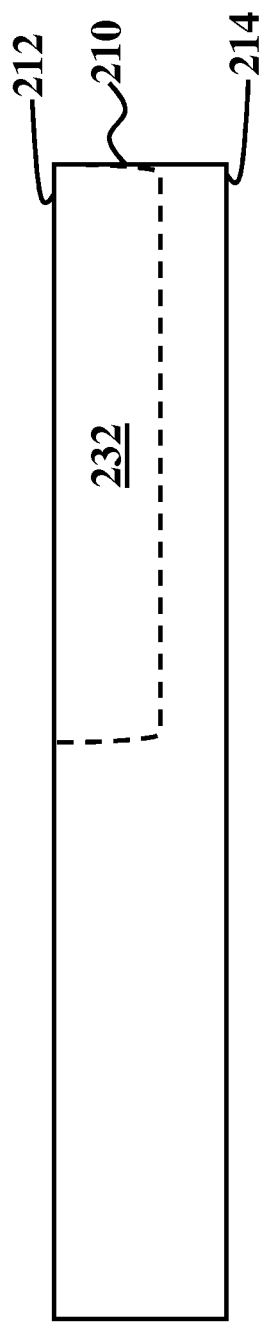

The following discussion, with reference to FIGS. 4-6, provides a resist removal technique for removing the patterned resist layer 220 from the wafer 210 that uses a combination of low temperature and high temperature heating processes to provide adequate heating for effectively removing the hardened, crust portion 220A while preventing or minimizing any popping or further hardening phenomena of the patterned resist layer 220. In FIG. 4, a first resist removal process step is performed to remove a portion of the patterned resist layer 220. The first resist removal process step substantially removes the hardened, crust portion 220A of the patterned resist layer 220. The first resist removal process step includes a resist stripping process 240. In the depicted embodiment, the resist stripping process 240 is a plasma ashing (etching) process having an etching chemistry and etching conditions suitable for removing the patterned resist layer 220. For example, the etching chemistry includes a fluorine-containing gas (such as $CF_4$), an oxygen-containing gas (such as $O_2$), a nitrogen-containing gas (such as $N_2$), other suitable gas, or a combination thereof.

The first resist removal process step further includes a heating process 250. In the present example, the heating process 250 is performed during the resist stripping process 240. The heating process 250 intermittently heats the patterned resist layer 220 from the front side 212 of the wafer 210. More specifically, a heat source is cycled on and off during the resist stripping process 240 to heat the patterned resist layer 220, particularly the hardened, crust portion 220A. The heat source is cycled on for a time period that sufficiently raises a temperature of the hardened, crust portion 220A to a temperature that facilitates adequate removal of the portion 220A without causing heat to accumulate in the portion 220A (accumulated heat can induce further hardening of the portion 220A and/or hardening of the portion 220B). Raising the temperature of the portion 220A increases an etching rate of the portion 220A. In an example, the heat source is cycled on to raise the temperature of the hardened, crust portion 220A to a temperature of about 100° C. to about 300° C. For example, the heat source is cycled on for about 20 seconds to about 30 seconds to raise the temperature of the hardened, crust portion 220A to a temperature of about 100° C. to about 300° C., and then, the heat source is cycled off until the temperature of the portion 220A and/or portion 220B returns to a temperature that minimizes further hardening of the portion 220A (for example, room temperature). By cycling the heat source on and off, heat accumulation in the patterned resist layer 220 is avoided. Further, during the heating process 250, a temperature of the wafer 210 is maintained at a temperature less than a popping temperature associated with the patterned resist layer 220, particularly a popping temperature of the portion 220B. For example, the wafer 210 is maintained at a temperature less than or equal to about 90° C. In another example, the wafer 210 is maintained at about room temperature (from about 20° C. to about 25° C.). In the depicted embodiment, a chilling process 260 is applied to the backside 214 of the wafer 210 to ensure that the heating process 250 (and/or resist stripping process 240) does not heat the portion 220B of the patterned resist layer 220 to its associated popping temperature.

The heating process 250 effects a graded thermal profile in the patterned resist layer 220. For example, a temperature of the patterned resist layer 220 increases along a direction substantially perpendicular to the wafer 210. In the depicted embodiment, a surface associated with the front side 212 of the wafer 210 (front surface) and a surface associated with the backside 214 of the wafer 210 (back surface) are substantially parallel to one another and are substantially in an x-y plane, such that a z-direction is substantially perpendicular to the wafer 210. In FIG. 4, the temperature of the patterned resist layer 220 increases along the z-direction, such that at a temperature ($T_1$) of the portion 220B is less than a temperature ($T_2$) of the portion 220A. The graded thermal profile ensures that the portion 220B has a temperature sufficient to facilitate removal of the portion 220A by the etching process while ensuring that the portion 220B has a temperature less than its associated popping temperature. The hardened, crust portion 220A is thus removed without hardening and/or popping issues that often arise during conventional resist removal processes.

In FIG. 5, a second resist removal process step is performed to remove the remaining portion of the patterned resist layer 220. In the depicted embodiment, the second resist removal process removes the portion 220B and any remaining hardened portion 220A of the patterned resist layer 220. The second resist removal process step includes a resist stripping process 270. In the depicted embodiment, the resist stripping process 270 is a plasma ashing (etching) process having an etching chemistry and etching conditions suitable for removing the remaining patterned resist layer 220 (here, portion 220B and any remaining hardened portion 220A). For example, the etching chemistry includes a fluorine-containing gas (such as $CF_4$), an oxygen-containing gas (such as $O_2$), a nitrogen-containing gas (such as $N_2$), other suitable gas, or combination thereof. In an example, the resist stripping process 240 and the resist stripping process 270 implement the same etching chemistries, such that a continuous flow of gas is maintained during the first and second resist removal process steps. In another example, the resist stripping process 240 implements an etching chemistry different than the resist stripping process 270. Further, the resist stripping process 240 and the resist stripping process 270 can implement same or different etching conditions.

The second resist removal process step further includes a heating process 280. In the present example, the heating process 280 is performed during the resist stripping process 270. The heating process 280 applies a heat source to the backside 214 of the wafer 210, thereby heating the patterned resist layer 220 from the backside 214 of the wafer 210. In the present example, the wafer temperature is raised to about 100° C. to about 300° C. Raising the temperature of the wafer 210 increases the temperature of the pattered resist layer 220, thereby increasing the etching rate of the patterned photoresist layer 220. The heating process 280 also effects a graded thermal profile in the patterned resist layer 220. For example, in the depicted embodiment, a temperature of the patterned resist layer 220 decreases along the z-direction, such that the temperature ($T_1$) of the pattered resist layer 220 is greater than the temperature ($T_2$) of the pattered resist layer 220. The graded thermal profile ensures that the portion 220B has a temperature sufficient to facilitate removal of the portion 220A by the etching process. The second resist removal process step is performed for a predetermined time or until the patterned resist layer 220 is removed from the wafer 210, as illustrated in FIG. 6. In an example, a cleaning process is performed to remove any residue left on the wafer after the first and second resist removal process steps.

The first and second resist removal process steps described herein facilitate improved removal of the patterned resist layer 220 when compared to conventional resist removal techniques. The first resist removal process step may be referred to as a low temperature ashing process, and the second resist removal process step may be referred to as a high temperature ashing process. The combined low and high temperature ashing processes of the disclosed resist removal technique prevent or minimize resist residue issues that arise during the conventional resist removal techniques. For example, the combination of front side and backside wafer heating provides sufficient temperatures for increasing the etching rate of the patterned resist layer 220 (particularly the hardened, crust portion 220A) while ensuring that the temperatures do not induce further hardening or popping phenomena of the patterned resist layer 220. Different embodiments may have different advantages, and no particular advantage is necessarily required of any embodiment.

The present disclosure provides many different embodiments for removing a resist layer. An exemplary method includes performing an etching process to remove a resist layer from a wafer. During the etching process, a first heating process is performed to effect a first graded thermal profile in the resist layer, the first graded thermal profile having a temperature that increases along a direction perpendicular to the wafer. Further during the etching process, after performing the first heating process, a second heating process is performed to effect a second graded thermal profile in the resist layer, the second graded thermal profile having a temperature that decreases along the direction perpendicular to the wafer. The wafer has a frontside and a backside, the resist layer is disposed over the front side of the wafer, the first heating process includes heating the resist layer from the front side of the wafer, and the second heating process includes heating the resist layer from the backside of the wafer. In an example, the method further includes, before performing the etching process, performing an ion implantation process to the wafer using the resist layer as a mask.

In an example, the first heating process further includes cooling the backside of the wafer. In an example, heating the resist layer from the front side of the wafer includes applying an intermittent heat source to the front side of the wafer, and heating the resist layer from the backside of the wafer includes applying a constant heat source to the backside of the wafer. In an example, the resist layer includes a hardened portion, and applying the intermittent heat source to the front side of the wafer includes, during the etching process, cycling the heat source on and off until the hardened portion of the resist layer is substantially removed, thereby leaving a remaining portion of the resist layer. In an example, the etching process is performed and the constant heat source is applied to the backside of the wafer until the remaining portion of the resist layer is removed. In an example, the heat source is cycled off before a temperature of the resist layer that is not hardened reaches a popping temperature.

In another example, a method includes forming a patterned resist layer over a wafer; and performing an ashing process to remove the patterned resist layer from the wafer. During the ashing process, a first heating process heats the patterned resist layer from the front side of the wafer while maintaining a wafer temperature of the wafer less than a popping temperature of the patterned resist layer, and after performing the first heating process, a second heating process heats the patterned resist layer from the backside of the wafer. In an example, heating the patterned resist layer from the front side of the wafer includes applying an intermittent heat source to the front side of the wafer, and heating the patterned resist layer from the backside of the wafer includes applying a constant heat source to the backside of the wafer. In an example, the patterned resist layer includes a hardened portion, and applying the intermittent heat source to the front side of the wafer includes, during the ashing process, cycling the heat source on and off until the hardened portion is substantially removed, thereby leaving a remaining portion of the patterned resist layer. In an example, the ashing process is performed and the constant heat source is applied to the backside of the wafer until the remaining portion is removed. In an example, maintaining the wafer temperature less than the popping temperature of the patterned resist layer includes maintaining the wafer temperature less than about 90° C.; and heating the patterned resist layer from the front side of the wafer includes cycling a heat source on and off to raise a temperature of crust of the patterned resist layer to about 100° C. to about 300° C. In an example, maintaining the wafer temperature less than the popping temperature of the resist layer includes cooling the wafer from the backside to keep a temperature of a non-crust portion of the patterned resist layer less than an associated popping temperature of the non-crust portion. In an example, the method further includes performing an ion implantation process using the patterned resist layer as a mask In yet another example, a method includes providing a wafer having a front side and a backside; forming a patterned resist layer over the front side of the wafer; performing an ion implantation process on the wafer using the patterned resist layer as a mask, wherein the patterned resist layer includes a crust after the ion implantation process; and performing a dry etching process to remove the patterned resist layer from the wafer. A first heating process is performed during the dry etching process until the crust of the patterned resist layer is substantially removed, thereby leaving a remaining portion of the patterned resist layer, wherein the first heating process includes applying a first heat source to the front side of the wafer, wherein the first heat source is cycled on and off. A second heating process is performed during the dry etching process to remove the remaining portion of the patterned resist layer, wherein the second heating process includes applying a second heat source to the backside of the wafer. In an example, the first heating process further includes cooling the wafer from the backside. In an example, applying the first heat source to the front side of the wafer and cooling the wafer from the backside raises a temperature of the crust without raising a temperature of the patterned resist layer above a popping temperature The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    performing an etching process to remove a resist layer from a wafer, wherein during the etching process:
        a first heating process is performed to effect a first graded thermal profile in the resist layer, the first graded thermal profile having a temperature that increases along a direction substantially perpendicular to the wafer, wherein the first heating process includes applying an intermittent heat source; and
        after performing the first heating process, a second heating process is performed to effect a second graded thermal profile in the resist layer, the second graded thermal profile having a temperature that decreases along the direction substantially perpendicular to the wafer, wherein the second heating process includes applying a constant heat source.

2. The method of claim 1 further including, before performing the etching process, performing an ion implantation process to the wafer using the resist layer as a mask.

3. The method of claim 1, wherein applying the intermittent heat source includes cycling the intermittent heat source on and off.

4. The method of claim 1, wherein the resist layer includes a negative tone resist.

5. The method of claim 1 wherein:
    the wafer has a frontside and a backside;
    the resist layer is disposed over the front side of the wafer; and
    the first heating process includes heating the resist layer from the front side of the wafer.

6. The method of claim 5 wherein the first heating process further includes cooling the backside of the wafer.

7. The method of claim 5 wherein the second heating process includes heating the resist layer from the backside of the wafer.

8. The method of claim 5 wherein:
    the resist layer includes a hardened portion; and
    applying the intermittent heat source to the front side of the wafer includes, during the etching process, cycling the intermittent heat source on and off until the hardened portion of the resist layer is substantially removed, thereby leaving a remaining portion of the resist layer.

9. The method of claim 8 wherein the etching process is performed and the constant heat source is applied to the backside of the wafer until the remaining portion of the resist layer is removed.

10. The method of claim 8 wherein the intermittent heat source is cycled off before a temperature of the resist layer that is not hardened reaches a popping temperature.

11. A method comprising:
    forming a patterned resist layer over a wafer; and
    performing an ashing process to remove the patterned resist layer from the wafer, wherein during the ashing process:
        a first heating process heats the patterned resist layer from a front side of the wafer while maintaining a wafer temperature of the wafer less than a popping temperature of the patterned resist layer, wherein heating the patterned resist layer from the front side of the wafer includes applying an intermittent heat source to the front side of the wafer, and
        after performing the first heating process, a second heating process heats the patterned resist layer from a backside of the wafer, wherein heating the patterned resist layer from the backside of the wafer includes applying a constant heat source to the backside of the wafer.

12. The method of claim 11 wherein maintaining the wafer temperature less than the popping temperature of the resist layer includes cooling the wafer from the backside to keep a temperature of a non-crust portion of the patterned resist layer less than an associated popping temperature of the non-crust portion.

13. The method of claim 11 further including performing an ion implantation process using the patterned resist layer as a mask.

14. The method of claim 11 wherein:
    the patterned resist layer includes a hardened portion; and
    applying the intermittent heat source to the front side of the wafer includes, during the ashing process, cycling the intermittent heat source on and off until the hardened portion is substantially removed, thereby leaving a remaining portion of the patterned resist layer.

15. The method of claim 14 wherein the ashing process is performed and the constant heat source is applied to the backside of the wafer until the remaining portion is removed.

16. The method of claim 11 wherein maintaining the wafer temperature less than the popping temperature of the patterned resist layer includes maintaining the wafer temperature less than about 90° C.

17. The method of claim 16 wherein the heating the patterned resist layer from the front side of the wafer includes cycling a heat source on and off to raise a temperature of crust of the patterned resist layer to about 100° C. to about 300° C.

18. A method comprising:
providing a wafer having a front side and a backside;
forming a patterned resist layer over the front side of the wafer;
performing an ion implantation process on the wafer using the patterned resist layer as a mask, wherein the patterned resist layer includes a crust after the ion implantation process;
performing a dry etching process to remove the patterned resist layer from the wafer, wherein:
a first heating process is performed during the dry etching process until the crust of the patterned resist layer is substantially removed, thereby leaving a remaining portion of the patterned resist layer, wherein the first heating process includes applying a first heat source to the front side of the wafer, wherein the first heat source is cycled on and off; and
a second heating process is performed during the dry etching process to remove the remaining portion of the patterned resist layer, wherein the second heating process includes applying a second heat source to the backside of the wafer.

19. The method of claim 18 wherein the first heating process further includes cooling the wafer from the backside.

20. The method of claim 19 wherein the applying the first heat source to the front side of the wafer and the cooling the wafer from the backside raises a temperature of the crust without raising a temperature of the patterned resist layer above a popping temperature.

* * * * *